United States Patent [19]

Arakawa et al.

[11] Patent Number: 4,497,875
[45] Date of Patent: Feb. 5, 1985

[54] CERAMIC SUBSTRATE WITH METAL PLATE

[75] Inventors: Hideo Arakawa; Keiichi Kuniya; Akio Chiba; Seiki Shimizu, all of Hitachi, Japan

[73] Assignee: Hitachi, Ltd., Tokyo, Japan

[21] Appl. No.: 464,945

[22] Filed: Feb. 8, 1983

[30] Foreign Application Priority Data

Feb. 10, 1982 [JP] Japan .................................. 57-18790

[51] Int. Cl.³ ............................................. B32L 15/00
[52] U.S. Cl. ................................... 428/620; 228/101; 428/621
[58] Field of Search ........................................ 428/620

[56] References Cited

U.S. PATENT DOCUMENTS 3,854,892  12/1974  Burgess et al. ...................... 428/620

FOREIGN PATENT DOCUMENTS 0012019  6/1980  European Pat. Off. ............ 428/620
55-50646  4/1980  Japan .

Primary Examiner—Veronica O'Keefe
Attorney, Agent, or Firm—Antonelli, Terry & Wands

[57] ABSTRACT

A ceramic substrate with metal plate, wherein a metal plate consisting mainly of copper is bonded to a ceramic substrate through a brazing layer consisting of a mixture of copper oxide and copper.

16 Claims, 4 Drawing Figures

CERAMIC SUBSTRATE WITH METAL PLATE

BACKGROUND OF THE INVENTION

The present invention relates to a ceramic substrate with a metal plate and a method of producing the same. More particularly, the invention is concerned with a ceramic substrate with a metal plate suitable for use as the substrate for a hybrid semiconductor integrated circuit, as well as to a method of producing such a substrate.

Generally, a semiconductor device referred to as "hybrid integrated circuit" has an insulation plate of a ceramic material, a metal plate constituting wiring laid on one side of the insulation plate, and semiconductor elements and other circuit elements placed on the metal plate. In order to efficiently remove the heat generated in the circuit elements, the semiconductor device often employs heat radiating plates or fins attached to the other side of the insulation plate.

The production of such a hybrid integrated circuit encounters various technical subjects or difficulties to be overcome.

A first technical subject is to eliminate breakdown of the semiconductor elements attributable to the fact that the circuit elements, particularly the semiconductor elements, metal plate and the insulation plate have different values of thermal expansion coefficient.

A second technical subject is to achieve a high reliability of the semiconductor device by making sure of the bonding between parts of different materials.

A third technical subject is to efficiently dissipate the heat generated in the circuit elements thereby to avoid malfunction of the circuit elements due to overheat.

Hitherto, as a measure for achieving the first technical subject mentioned above, it has been proposed and actually conducted to dispose, between the semiconductor elements and the metal plate, a buffer plate made of a metal having a thermal expansion coefficient approximating that of the semiconductor element, e.g. molybdenum, tungsten, Fe-Ni alloy and so forth. This way of solution, however, undesirably imposes a difficulty in achieving the third technical subject, i.e. the efficient dissipation of the heat, partly because the buffer plate and the bonding layers increase the length of path of heat to be dissipated and partly because the buffer plate itself has a large thermal resistance. In addition, the semiconductor becomes less reliable and the yield is decreased due to increase in the number of parts employed and the number of steps of the production process.

As a measure for simultaneously achieving the first to third technical subjects to some extent, it has been proposed to interpose, between the semiconductor elements and the insulation plate, a composite material produced by embedding carbon fibers in a copper matrix. This copper-carbon fibers composite material has simultaneously both of high thermal/electric conductivities inherent to the copper and small thermal expansion peculiar to carbon fibers advantageously. In addition, the thermal expansion coefficient can be varied as desired by varying the carbon fibers content. Therefore, the use of copper-carbon fibers composite material interposed between the semiconductor elements and the insulation plate offers the following advantages over the known construction which employs the buffer plate mentioned above.

(1) The problem attributable to the difference in thermal expansion coefficients between the semiconductor elements and insulation plate can be overcome solely by the use of the composite material.
(2) As a result, the thickness of the insulation plate can be decreased.
(3) The thermal resistance of the device as a whole can be decreased because it is possible to eliminate the buffer plate which has large thermal resistance and to thin the insulation plate which also has large thermal resistance.
(4) The reliability of bonding can be improved because the number of parts and, hence, the number of portions requiring bonding are decreased.

The bonding between a metal plate and an insulation plate such as of a ceramics material is usually conducted by a method in which films of a metal wettable to the bond are formed on both bonding surfaces by evaporation, plating, metallizing or the like technic. For instance, when solder consisting mainly of lead is used as the bond, films of Ni, Cr-Ni-Ag alloy or the like material are formed beforehand on the bonding surfaces of the metal plate and the insulation plate, and thereafter both are bonded by the solder. Thus, since the bonding is made through at least three metallic layers all of which are generally made of materials having large thermal resistance, it is impossible to sufficiently reduce the thermal resistance between the semiconductor elements and the insulation plate.

Thus, in order to reduce the heat dissipation resistance so as to increase the capacity of a hybrid integrated circuit, it is most important among others to reduce the thermal resistance in the bonding layer between the metal plate and the ceramic plate.

SUMMARY OF THE INVENTION

Accordingly, an object of the invention is to provide a ceramic substrate with metal plate in which the thermal resistance of the bonding layer between the metal plate and the ceramic plate is reduced, as well as a method of producing such a ceramics substrate.

Another object of the invention is to provide a ceramic substrate with a metal plate suitable for a hybrid integrated circuit, as well as a method of producing such a ceramic substrate.

To these ends, according to an aspect of the invention, there is provided a ceramic substrate with metal plate characterized in that a metal plate containing copper and a ceramics plate are bonded to each other by means of a brazing material of copper oxide-copper system such as $Cu_2O$—Cu or CuO—Cu, etc. The metal plate containing copper may be a plate consisting essentially of copper, copper-carbon fibers composite material, copper alloys or the like. Plates sintered from, for example, $Al_2O_3$, MgO, $SiO_2$, $ZrO_2$ and so forth may be used as the ceramics substrate. When the ceramics substrate with metal plate is used in a hybrid integrated circuit, it is desirable to use alumina as the ceramic plate.

According to another aspect of the invention, there is provided a method of producing a ceramic substrate with metal plate characterized in that a layer of mixture of copper oxide and copper is interposed between a metal plate containing copper and a ceramic plate and the thus formed laminated structure is heated at a temperature sufficiently high for melting the mixture layer. For facilitating the control of the composition ratio of the mixture, the mixture is formed in the form of powder which is then turned into a slurry by stirring and blending after addition of water or aqueous solution of methyl cellulose, the slurry being then applied to the bonding surfaces. This method is easy to carry out and, hence, preferred. In this production method, the heating temperature, the composition ratio of $Cu_2O$—Cu or CuO—Cu and the atmosphere in which the bonding is carried out are important factors.

Experiments were conducted with brazing materials having various $Cu_2O$—Cu or CuO—Cu composition ratios and as a result it was confirmed that from the view point of bonding ability between the alumina plate and the copper-carbon fibers composite material the best bonding is attainable by the use of Cu—3.5 wt % $Cu_2O$ consisting essentially of 3.5 wt % of powdered $Cu_2O$ and the balance substantially powdered Cu. This composition is an eutectic composition in $Cu_2O$—Cu binary system. The bonding was made successfully at brazing temperature above 1065° C. but below the melting point of Cu.

It was confirmed also that practically satisfactory bonding effect is achieveable in either of a case where the $Cu_2O$ content is varied between 1 and 23 wt % in the $Cu_2O$—Cu system and a case where the CuO content is varied in a range substantially equal to that mentioned above, provided that the bonding is conducted at a temperature above 1065° C.

Thus, there are certain allowance or margin for the composition ratios of $Cu_2O$, CuO and Cu. Basically, however, the composition Cu—3.5 wt % $Cu_2O$ is most preferred from the view point of bonding ability. Particularly, an excellent result is obtained when the CuO content or $Cu_2O$ content ranges between 1 and 5 wt %.

In order to prevent fluctuation of the $O_2$ ratio in $Cu_2O$ or O ratio in CuO, it is essential that the bonding is conducted in the atmosphere of an inert gas or $N_2$ gas. For information, if the bonding is conducted in the atmosphere of a reducing gas such as $H_2$, the CuO or $Cu_2O$ are reduced to deteriorate the bonding ability.

DESCRIPTION OF THE PREFERRED EMBODIMENTS

Figure 1:
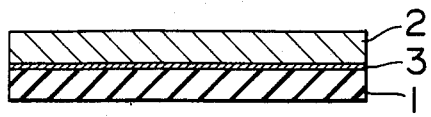
FIG. 1 is a schematic sectional view of a ceramic substrate in accordance with an embodiment of the invention.

Referring first to FIG. 1, a ceramic substrate with metal plate in accordance with a first embodiment of the invention has a ceramic insulation plate 1 made of, for example, alumina, a metal plate 2 made form a copper-carbon fibers composite material and a brazing layer 3 made of $Cu_2O$ or CuO for brazing the metal plate 2 to one side of the insulation plate 1.

The copper-carbon fibers composite material exhibits an anisotropy in thermal expansion characteristics depending on the array of the carbon fibers. Therefore, the composite material used as the lead plate or heat radiating plate of a hybrid integrated circuit should have such an array of carbon fibers as would not cause any change in thermal expansion characteristics regardless of the shape thereof.

Figure 2A:
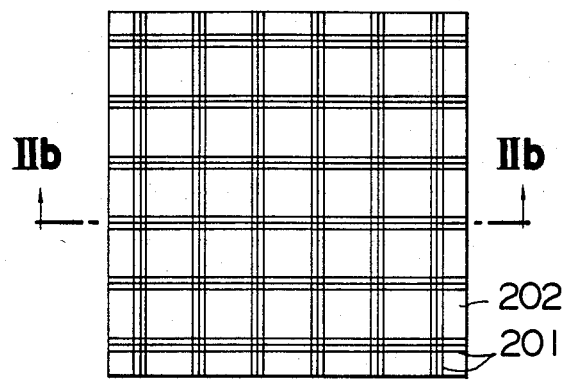
FIG. 2 is a schematic illustration of a copper-carbon fibers composite material suitable for use as a metal plate in a ceramic substrate with metal plate in accordance with the invention.
Figure 2B:
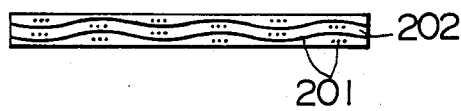

FIG. 2 shows, by way of example, a copper-carbon fibers composite material in which carbon fibers 201 are arrayed in a lattice-like form in the matrix of a copper plate 202. This composite material is produced by plating carbon fiber of, for example 6 to 9 μm in diameter with copper, forming bundles of the plated carbon fibers, each bundle consisting of several carbon fibers, arraying the bundles in a lattice-like from, and efecting a hot press at a temperature between 500° C. and melting temperature of copper and a pressure of between 150 and 400 kgf/cm². The carbon fibers content in the composite material id determined in accordance with required level of thermal expansion coefficient. The thermal expansion coefficient of the metal plate 2 shown in FIG. 1 varies depending on the use. For instance, when the metal plate 2 is used in a hybrid integrated circuit, the thermal expansion coefficient thereof has to be determined on the basis of the thermal expansion coefficient of the semiconductor element and that of the insulation plate 1. Actually, however, there is a considerably large difference in the thermal expansion coefficients between the silicon as the material of semiconductors and the alumina as the material of the insulation material. Therefore, the thermal expansion coefficient of the metal plate is determined in accordance with the shapes of semiconductor elements and allowable thermal stress, and the metal plate usually contains 35 to 56 vol % of carbon fibers, although the carbon fibers content varies to some extent depending on the modulus of elasticity of the carbon fibers.

The brazing layer 3 can be formed in the following manner. Powder of $Cu_2O$ (or CuO) and powder of Cu are prepared and mixed at a predetermined composition ratio. The mixture powder is then interposed between the insulation plate 1 and the metal plate 2. This sandwich structure is then pressed and heated in an inert gas atmosphere. In this brazing layer, $Cu_2O$ or CuO is contained to increase the wettability of the ceramic such as alumina to Cu under the presence of oxygen, while Cu is contained to obtain a brazing layer having a good heat conductivity. From this point of view, the composition ratio between $Cu_2O$ or CuO and Cu is of great significance, and is selected to fall within the range of between 1 wt. % $Cu_2O$ (or CuO)—Cu and 23 wt. % $Cu_2O$ (or CuO)—Cu, preferably between 1 wt. % $Cu_2O$ (or CuO)—Cu and 5 wt. % $Cu_2O$ (or CuO)—Cu. For precisely controlling the composition ratio between $Cu_2O$ (or CuO) and Cu, it is advisable to mix both powders in water or an aqueous solution at a predetermined mixing ratio and then stirring them to form a slurry.

The ceramic substrate with metal plate having a structure in accordance with the first embodiment of the invention offers the following advantages.

(1) Since the metal plate and the insulation plate made of ceramic are directly bonded to each other through a brazing layer, the metal film coated on each bonding surface for brazing purpose can be omitted thereby making it possible to obtain bonding area of small thermal resistance.

(2) Since the metal plate is composed of a copper-carbon fibers composite material, it is possible to approximate a thermal expansion coefficient of the metal plate to that of the insulation plate and, hence, to reduce the thermal stress between the metal plate and the insulation plate. This in turn makes it possible to thin the insulation plate and, accordingly, to obtain a ceramic substrate with metal plate of small thermal resistance.

(3) Since the brazing material consisting essentially of $Cu_2O$—Cu or CuO—Cu has a good heat conductivity owing to the fact that copper takes the major part of the composition and since it has a good wettability to the ceramic and the copper-carbon fibers composite material, it is possible to reduce the thermal resistance in bonding area.

Figure 3:
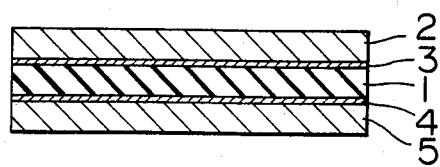
FIG. 3 is a schematic sectional view of another embodiment of the invention.

FIG. 3 shows a ceramic substrate with metal plate in accordance with a second embodiment of the invention. This embodiment differs from the embodiment shown in FIG. 1 in that a metal plate 5 made of a copper-carbon fibers composite material is bonded also to the other side of the insulation plate 1 through the brazing layer 4 consisting essentially of $Cu_2O$—Cu or CuO—Cu. The brazing layer 4 and the metal plate 5 themselves are identical to the brazing layer 3 and the metal plate 2 which are used in the first embodiment.

This structure offers, in addition to the advantages presented by the first embodiment shown in FIG. 1, the advantage in that the undesirable warp or thermal distortion of the substrate is prevented regardless of the difference in thermal expansion coefficients between the ceramic plate and the metal plate, because metal plates of an equal thermal expansion coefficient are bonded to both sides of the ceramic plate.

Figure 4:
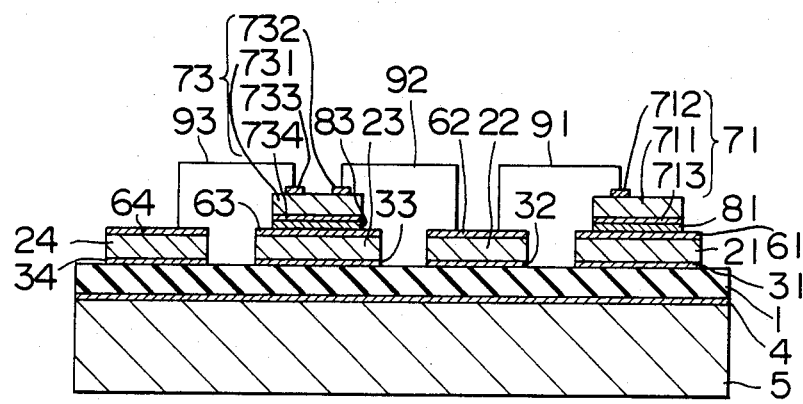
FIG. 4 is a schematic sectional view of a hybrid integrated circuit device incorporating a ceramic substrate in accordance with the invention.

FIG. 4 shows an example of a hybrid integrated circuit device incorporating a ceramics substrate with metal plate in accordance with an embodiment of the invention, in which the same reference numerals are used to denote the same parts or members as those used in the embodiment shown in FIG. 3. The hybrid integrated circuit device has an insulation plate 1 made from alumina and a plurality of metal plates 21, 22, 23 and 24 fuctioning as lead plates and made of copper-carbon fibers composite material and bonded to one side of the insulation plate 1 through respective brazing layers 31, 32, 33 and 34 made from $Cu_2O$—Cu or CuO—Cu. To the other side of the insulation plate 1, bonded through a brazing layer 4 consisting of $Cu_2O$—Cu or CuO—Cu is a metal plate 5 functioning as a heat radiating plate and made of a copper-carbon fibers composite material. Reference numerals 61, 62, 63 and 64 denote copper films coated on the upper surfaces of the metal plates 21, 22, 23 and 24. A semiconductor element 71 consisting of a semiconductor pellet 711 and ohmic contacts 712 and 713 is placed on the metal plate 21. Similarly, a semiconductor element 73 consisting of a semiconductor pellet 731 and ohmic contacts 732, 733 and 734 is placed on the metal plate 23. Numerals 81 and 83 denote brazing layers. The numerals 91, 92 and 93 designate bonding wires which are connected, respectively, between the ohmic contact 712 and the copper coating film 62, between the ohmic contact 732 and the copper coating film 62 and between the ohmic contact 733 and the copper coating film 64. The copper coating films 61, 62, 63 and 64 are intended for improving the wettability of the metal plates 21, 22, 23 and 24 to the solder and for improving the bonding ability of the metal plates 21, 22, 23 and 24 to the bonding wires 91, 92 and 93. These copper coating films may be formed by bonding copper foils simultaneously with when forming the copper-carbon fibers composite material by hot press. By so doing, it is possible to simplify the production process.

According to the hybrid integrated circuit of this structure, it is possible to remarkably improve the heat radiation from the semiconductor elements, partly because the bonding between the insulation plate 1 and the metal plate 5 and the bonding between the insulation plate 1 and the metal plates 21 and 23 can be made directly by the brazing layer 4 and the brazing layers 31 and 33, respectively, and partly because the brazing layers are made of a material having a small thermal resistance. Clearly, this contributes to an increase in the electric current capacity of the device. Furthermore, the process for improving the bonding ability in the bonding area between the insulation plate and the metal plate is eliminated to reduce the number of steps in the production process.

Practical examples of the invention will be described hereinunder.

A plurality of bundles of copper-plated carbon fibers were prepared. Each bundle contained 3000 pieces of copper-plated carbon fiber of 6 μm dia. A network of the bundles of copper-plated carbon fibers was knitted (plain weave) from warps and wefts constituted by these bundles. The network was then placed in a graphite mold and was hot-pressed at a temperature of 1000° C. and a pressure of 250 Kg/cm$^2$ to form a copper-carbon fibers composite material as shown in FIG. 3.

Copper-carbon fibers composite materials were prepared as the materials for the lead plates and the heat radiation plate, respectively, by the process explained above. The composite material for the lead plates had a carbon fibers content of 54 vol. % and square form having side length of 30 mm and thickness of 0.5 mm. On the other hand, the composite material for the heat radiation plate had a carbon fibers content of 35 vol % and a square form having a side length of 30 mm and thickness of 2 mm. Furthermore, in the composite material for the lead plates, a copper foil of 20 μm thick was adhered to one side of the composite material during hot-pressing.

On the other hand, powders of $Cu_2O$ and Cu of particle size of −325 mesh were prepared and mixed with each other at a Cu:$Cu_2O$ mixing rate of 96:4 by weight percent. After stirring and blending these powders, 1% aqueous solution of methyl cellulose was added to the admixture of the powders by an amount which is three times as large as that of the mixture powders to form a slurry of $Cu_2O$—Cu powders.

This slurry was applied to both sides of a square alumina plate having a side length of 30 mm and a thickness of 0.25 mm prepared separately. The slurry was then dried at a temperature of 50° C. Thereafter, the lead plates with copper foils and made of the copper-carbon fibers composite material, the alumina plate with $Cu_2O$—Cu powders ataching thereto and the heat radiation plate made of the copper-carbon fibers composite material were stacked in layers in the mentioned order. After placing a weight of stainless steel on the stacked layers, the latter was heated to and maintained at 1065° to 1075° C. in the atmosphere of $N_2$ gas.

A ceramic substrate with metal plate was thus formed to have, as illustrated in FIG. 4, a ceramic insulation plate 1, metal plates 21, 22, 23 and 24 made of copper-carbon fibers composite material and placed on the insulation plate 1, and a metal plate 5 made of the copper-carbon fibers composite material and fixed to the lower side of the insulation plate 1.

A comparative ceramic substrate with metal plate according to the prior art was produced using the copper plates of the same sizes as the metal plates 21, 22, 23, 24 and 5 made of the copper-carbon fibers composite material used in the substrate of the invention. This comparative substrate showed a warp which is as large as 100 to 200 μm after the bonding of the copper plates. In contrast, the warp was as small as 0 to 40 μm in the substrate of the invention having the metal plates made of the copper-carbon fibers composite material.

It has thus proved that the copper-carbon fibers composite material is quite effective as the material of lead plates and heat radiation plate which are to be bonded to a ceramic insulation plate, also from the view point of elimination of warp.

Two pieces of square semiconductor (Si) pellets, each having a side length of 7.5 mm and a thickness of 220 μm were soldered to the ceramic substrate with plates of copper-carbon fibers composite material thus produced, simulating the semiconductor device shown in FIG. 4, and the thermal resistance was measured and as a result it exhibited a small thermal resistance of 0.8° to 1.2° C./W.

For a comparison purpose, a substrate was formed by forming an Ni-plated layer of 50 to 7 μm thick on each of the ceramics insulation plate 1 and metal plates 21, 22, 23, 24 and 5 of copper-carbon fibers composite material and bonding them with a conventional Pb-Sn solder in place of the $Cu_2O$—Cu brazing layer used in the invention. This substrate showed a thermal resistance as large as 1.3° to 1.6° C./W.

This tells that the thermal resistance is decreased considerably in the substrate of the invention thanks to the use of the $Cu_2O$—Cu as the brazing material.

It is to be noted here that, although the practical embodiment has been described with specific reference to the brazing material made of $Cu_2O$—Cu, this is not exclusive and a substantially equal effect is achieveable by the use of CuO—Cu as the brazing material.

Although the invention has been described through a specific embodiment, it is to be understood that the described embodiment is only illustrative and the following modifications are possible without departing from the scope of the invention.

(1) It is possible to use copper or copper alloy in place of the copper-carbon fibers composite material although the latter is specifically mentioned in the description of embodiment. When copper or copper alloy is used in place of the copper-carbon fibers composite material, it is advisable to take a suitable measure for eliminating the difference in thermal expansion coefficients between the metal plate and the ceramic plate, e.g. addition of powders of tungsten, molybdenum, etc. or fibers to the metal plate, and so forth.

(2) It is possible to apply the invention to other devices than the described semiconductor device, provided that such devices include bonding between a ceramic plate and a metal plate.

What is claimed is:

1. A ceramic substrate with a metal-containing plate comprising a metal-containing plate comprised mainly of copper, an insulation plate consisting of a sintered ceramic material and a brazing layer interposed between said metal-containing plate and said ceramic insulation plate for bonding said plates to each other, said brazing layer consisting of a mixture of copper oxide and copper.

2. A ceramic substrate with a metal-containing plate according to claim 1, wherein said brazing layer consists of 1 to 23 wt. % of copper oxide and a balance of copper.

3. A ceramic substrate with a metal-containing plate according to claim 2, wherein said metal-containing plate is made of a copper-carbon fibrous composite material.

4. A ceramic substrate with a metal-containing plate according to claim 3, wherein said metal-containing plate consists essentially of copper.

5. A ceramic substrate with a metal-containing plate according to claim 2, wherein said insulation plate consists essentially of alumina.

6. A ceramic substrate with a metal-containing plate according to claim 5, wherein said metal-containing plate is made of a copper-carbon fibrous composite material.

7. A ceramic substrate with a metal-containing plate according to claim 6, wherein said brazing layer consists of 1 to 23 wt. % of copper oxide and a balance of copper.

8. A ceramic substrate with a metal-containing plate according to claim 1, wherein said brazing layer consists of 1 to 5 wt. % of copper oxide and a balance of copper.

9. A ceramic substrate with a metal-containing plate according to claim 1, wherein said insulation plate is a ceramic material selected from the group consisting of $Al_2O_3$, MgO, $SiO_2$ and $ZrO_2$.

10. A ceramic substrate with metal-containing plates comprising an insulation plate consisting of a sintered ceramic material, first and second plates comprised mainly of copper and disposed on both sides of said insulation plate and first and second brazing layers interposed, respectively, between said insulation plate and said first and second copper-containing plates to bond the insulation plate to the copper-containing plates, said brazing layer consisting of a mixture of copper oxide and copper.

11. A ceramic substrate with metal-containing plates according to claim 10, wherein said brazing layers each consist of 1 to 23 wt. % of copper oxide and a balance of copper.

12. A ceramic substrate with metal-containing plates according to claim 11, wherein said metal plates are made of a copper-carbon fibrous composite material.

13. A ceramic substrate with metal-containing plates according to claim 12, wherein said insulation plate is made of alumina.

14. A ceramic substrate with metal-containing plates according to claim 10, wherein said brazing layer consists of 1 to 5 wt. % of copper oxide and a balance of copper.

15. A ceramic substrate with metal-containing plates according to claim 10, wherein said ceramic material is selected from the group consisting of $Al_2O_3$, MgO, $SiO_2$ and $ZrO_2$.

16. A bonded assembly which comprises:
a copper-containing plate consisting essentially of copper, a copper-carbon fibrous composite, or a copper alloy;
an insulation plate consisting of a sintered ceramic material; and
a brazing layer consisting essentially of a mixture of copper oxide and copper, and interposed between said copper-containing plate and said insulation plate to bond both plates together.

* * * * *